United States Patent
Winstead et al.

(10) Patent No.: US 7,435,639 B2
(45) Date of Patent: Oct. 14, 2008

(54) DUAL SURFACE SOI BY LATERAL EPITAXIAL OVERGROWTH

(75) Inventors: Brian A. Winstead, Austin, TX (US); Omar Zia, Austin, TX (US); Mariam G. Sadaka, Austin, TX (US); Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 370 days.

(21) Appl. No.: 11/443,627

(22) Filed: May 31, 2006

(65) Prior Publication Data

US 2007/0281446 A1    Dec. 6, 2007

(51) Int. Cl.
*H01L 21/8238* (2006.01)
(52) U.S. Cl. ............... 438/199; 438/311; 257/E21.632
(58) Field of Classification Search ........... 438/199, 438/311, 479, 967; 257/E21.632
See application file for complete search history.

(56) References Cited

U.S. PATENT DOCUMENTS

| | | | |
|---|---|---|---|
| 6,902,962 B2 | 6/2005 | Yeo et al. | 438/150 |
| 7,385,257 B2 * | 6/2008 | Ieong et al. | 257/369 |
| 2004/0256700 A1 | 12/2004 | Doris et al. | 257/627 |
| 2005/0045995 A1 | 3/2005 | Ieong et al. | 257/627 |
| 2005/0070077 A1 | 3/2005 | Guarini et al. | 438/479 |
| 2005/0082531 A1 | 4/2005 | Rim | 257/72 |
| 2005/0116290 A1 | 6/2005 | de Souza et al. | 257/347 |

OTHER PUBLICATIONS

G. Shahidi et al., "Fabrication of CMOS on Ultrathin SOI Obtained by Epitaxial Lateral Overgrowth and Chemical-Mechanical Polishing," 1990 IEEE, IEDM 90, pp. 587-590.
M. Yang et al., "High Performance CMOS Fabricated on Hybrid Substrate with Different Crystal Orientations," 2003 IEEE, IEDM 03, pp. 453-456.

* cited by examiner

*Primary Examiner*—Hoai v Pham
(74) *Attorney, Agent, or Firm*—Hamilton & Terrile, LLP; Michael Rocco Cannatti

(57) ABSTRACT

A semiconductor process and apparatus provide a planarized hybrid substrate (18) by exposing a buried oxide layer (80) in a first area (99), selectively etching the buried oxide layer (80) to expose a first semiconductor layer (70) in a second smaller seed area (98), and then epitaxially growing a first epitaxial semiconductor material from the seed area (98) of the first semiconductor layer (70) that fills the second trench opening (100) and grows laterally over the exposed insulator layer (80) to fill at least part of the first trench opening (99), thereby forming a first epitaxial semiconductor layer (101) that is electrically isolated from the second semiconductor layer (90). By forming a first SOI transistor device (160) over a first SOI layer (90) using deposited (100) silicon and forming first SOI transistor (161) over an epitaxially grown (110) silicon layer (101), a high performance CMOS device is obtained.

20 Claims, 7 Drawing Sheets

US 7,435,639 B2

DUAL SURFACE SOI BY LATERAL EPITAXIAL OVERGROWTH

BACKGROUND OF THE INVENTION

1. Field of the Invention

The present invention is directed in general to the field of semiconductor devices. In one aspect, the present invention relates to high-performance field effect transistors (FETs) fabricated on hybrid or dual substrates.

2. Description of the Related Art

To address the difference in electron and hole mobility values for NMOS and PMOS transistor devices formed on semiconductor wafers having a single crystal orientation, integrated circuit devices are increasingly fabricated with hybrid substrates with different surface orientations using semiconductor-on-insulator (SOI) wafer bonding to provide PMOS and NMOS devices with their own optimized crystal orientation. Prior attempts to integrate dual or hybrid substrates have used bulk silicon to form at least one of the PMOS and NMOS substrates, resulting in degraded performance compared to SOI substrates. For example, bulk silicon substrates have increased junction capacitance Cj and stacked gate penalty as compared to SOI substrates. The redesign and integration development costs of overcoming the performance limitations of bulk silicon can be substantial. In addition, when bulk silicon (or, for that matter, SOI silicon) is used as a single orientation surface to form FinFET CMOS devices, a forty-five degree alignment is required between NMOS and PMOS devices, creating layout and design penalties. While fully SOI dual surface orientation (DSO) integrations have been proposed to address some of these drawbacks, such integrations are overly complex, use inferior semiconductor substrate formation processes (e.g., using SIMOX techniques), use complicated substrate structures (e.g., wafer bonding), and/or do not maintain planarity between regions of different crystallographic orientation.

Accordingly, a need exists for a semiconductor manufacturing process for fabricating dual surface orientation devices which overcomes bulk performance limitations and avoids the redesign or integration costs associated with overcoming the process and performance limitations associated with bulk devices. There is also a need for an improved process for manufacturing DSO devices that obtain the performance benefits of SOI substrates, while maintaining the performance benefits of bulk substrates. A method for manufacturing aligned FinFET CMOS devices is also needed to overcome the layout and design penalties imposed by single orientation substrates. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
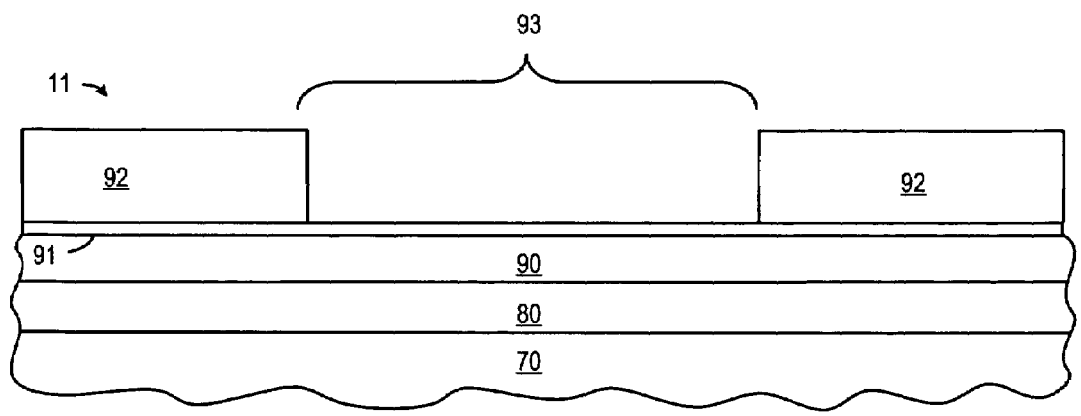
FIG. 1 is a partial cross-sectional view of a semiconductor wafer structure on which an etched nitride mask layer is formed over SOI layers and a semiconductor substrate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS devices with hybrid or dual surface orientations using lateral epitaxial overgrowth to form SOI and quasi SOI CMOS devices. Using lateral epitaxial overgrowth from one or more seed areas in an underlying bulk semiconductor substrate, semiconductor layers or seed regions can be grown from the bulk semiconductor and over an insulator layer to form SOI substrates. Depending on the size and configuration of the seed regions, the SOI devices (e.g., MOSFET transistors) formed over the overgrown semiconductor layers may be placed so that at least the source region (if not also the channel region) is located over the seed region, though the drain region may also be located over a seed region when multiple seed regions are formed. In addition or in the alternative, SOI devices formed over the overgrown semiconductor layers may be placed so that the drain region is located over a buried oxide layer, thereby reducing the drain-side junction capacitance. Moreover, the overgrown semiconductor layer may be formed over a buried SOI oxide layer that has been partially thinned, thereby providing a relatively thicker SOI semiconductor substrate. The seed regions may be retained as part of any final device structure, or may be removed by forming isolation regions that isolate first and second SOI layers. Any desired selective etch process may be used to form seed regions by removing portions of the buried SOI oxide layer to form openings that expose the semiconductor substrate. In an illustrative embodiment, the seed regions are formed by selectively masking a portion of the buried SOI oxide layer with a nitride etch mask (e.g., using a combination of oxide sidewall spacers and a sacrificial nitride layer), etching the unmasked region through the buried SOI oxide layer and down to the underlying semiconductor layer to form a seed area, removing the nitride etch mask and then using a lateral epitaxial overgrowth process to form an epitaxial semiconductor layer from the seed area.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Turning now to FIG. 1, a partial cross-sectional view is illustrated of a semiconductor wafer structure 11 on which a first oxide layer 91 (e.g., pad oxide) and etched nitride mask layer 92 are formed over semiconductor-on-insulator (SOI) layers 80 (an insulating dielectric), 90 (a semiconductor) and a semiconductor substrate layer 70. Specifically, the structure 11 includes a first semiconductor layer 70 formed of a semiconductor material that has a first crystallographic orientation. Depending on the type of transistor device being fabricated, the first semiconductor layer 70 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor layer 70 may be appropriately doped to provide n-type (electron) and p-type (hole) carriers. The crystallographic orientation of the first semiconductor layer 70 may be (110), (111), or (100).

In the SOI layers, the structure 11 includes an insulator layer 80 formed on the first semiconductor layer 70 which will ultimately be used to form the buried oxide (BOX) layer for semiconductor-on-insulator devices. In addition, the SOI layers include a second semiconductor layer 90 formed of a semiconductor material which may have a second crystallographic orientation which is different from the first crystallographic orientation, though as will be appreciated, it is not necessary that the second semiconductor layer 90 have a different crystallographic orientation unless required for the FinFET or "high mobility PFET" applications. Depending on the type of transistor device being fabricated, the second semiconductor layer 90 may be formed from any semiconductor material, including, for example, Si, SiC, SiGe, SiGeC, Ge, GaAs, InAs, InP as well as other Group IV, III/V or II/VI compound semiconductors or any combination thereof. It will also be appreciated that the second semiconductor layer 90 may be appropriately doped to provide n-type (electron) and p-type (hole) carriers. The crystallographic orientation of the second semiconductor layer 90 may be (100), (111), or (110), so long as the crystallographic orientation of the second semiconductor layer 90 differs from the crystallographic orientation of the first semiconductor layer 70. The crystal orientations of the first semiconductor layer 70 and the second semiconductor layer 90 will depend on the materials used to form the wafer structure 11. For example, when Si is employed as the semiconductor material, electron mobility is higher on a (100) surface orientation, and hole mobility is higher on a (110) surface orientation, provided that the channel direction is oriented in the <110> direction. In this case, the (100) Si surface is used as the substrate layer for NMOS devices, while the (110) Si surface is used as the substrate layer for PMOS devices. As depicted in FIG. 1, an oxide layer 91 is formed on the second semiconductor layer 90, followed by formation of an etched nitride mask layer 92 which defines an mask opening 93.

Figure 2:
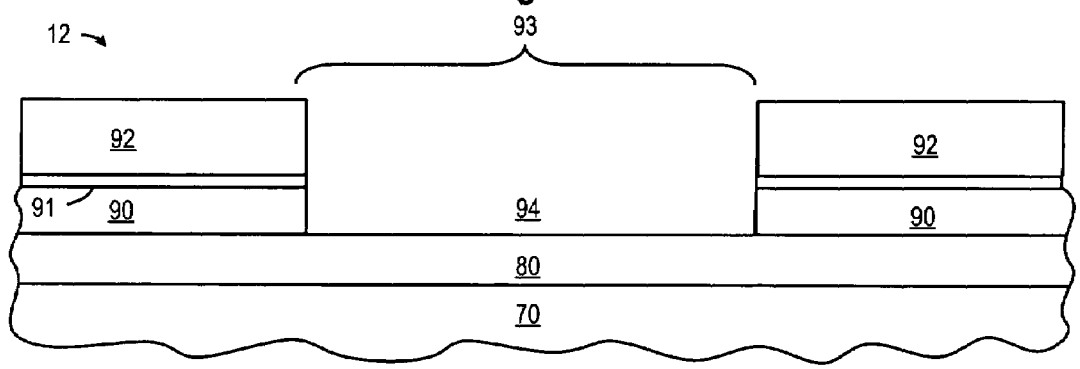
FIG. 2 illustrates processing subsequent to FIG. 2 where portions of an SOI semiconductor layer have been etched or removed to form a first opening.

FIG. 2 illustrates processing of a semiconductor wafer structure 12 subsequent to FIG. 1 where portions of the first oxide layer 91 and the SOI semiconductor layer 90 have been etched or removed to form a first opening 94. In particular, using the etched nitride mask layer 92, conventional patterning and anisotropic etching techniques may be used to form an opening 94 through the second semiconductor layer 90. In this opening 94, an oxide layer 96 is formed to replace the second semiconductor layer 90 in the opening 94 by depositing an overlying layer of oxide and then polishing the oxide back substantially to substantially coplanar level 97 with the mask layer 92 (as shown by the semiconductor wafer structure 13 depicted in FIG. 3) or back to the level of the second semiconductor layer 90 (not shown).

Figure 3:
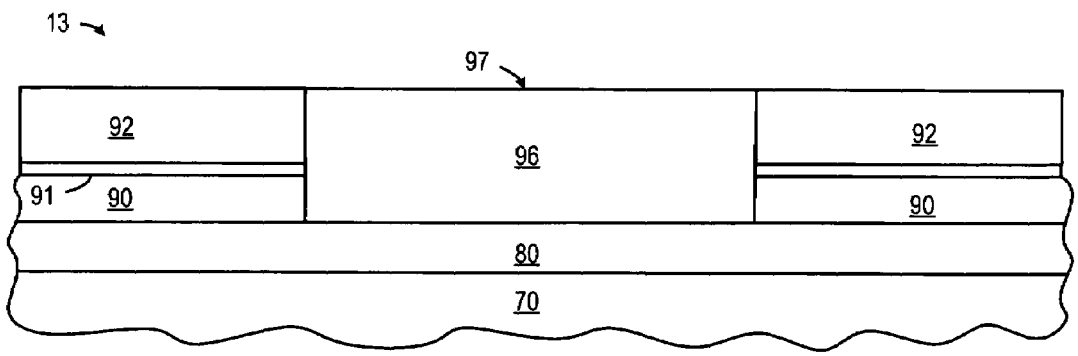
FIG. 3 illustrates processing subsequent to FIG. 2 after the first opening is filled with a deposited oxide layer and polished.
Figure 4:
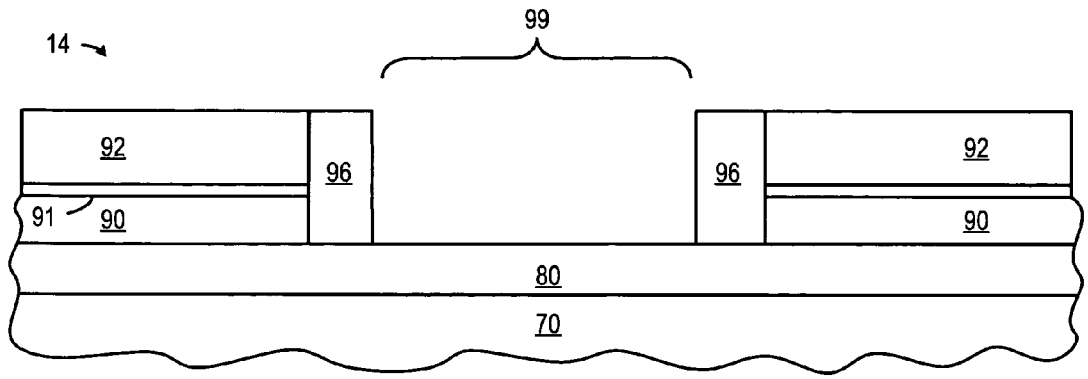
FIG. 4 illustrates processing subsequent to FIG. 3 after portions of the deposited oxide layer have been etched or removed to form a second opening that exposes a buried SOI oxide layer.

FIG. 4 illustrates processing of a semiconductor wafer structure 14 subsequent to FIG. 3 after portions of the deposited oxide layer 96 have been etched or removed to form a second opening 99 that exposes a buried SOI oxide layer 80. Any desired patterning and etching process may be used to form the opening 99. For example, portions of the deposited oxide layer 96 may be etched or removed using a mask or photoresist (not shown) to remove an exposed portion of the oxide layer 96, thereby forming a second etch opening 99 to expose the buried SOI oxide layer 80. The pattern transfer and etching of the mask layer may use one or more etching steps to selectively remove the unprotected portions of the oxide layer 96, including a dry etching process such as reactive-ion etching, ion beam etching, plasma etching or laser etching, a wet etching process wherein a chemical etchant is employed or any combination thereof.

The opening 99 is used to define and differentiate active regions for first and second types of MOS devices subsequently formed on the wafer structure 14. For example, the unetched portions of the second semiconductor layer 90 define a first device region for a first type of MOS device, while the region defined by the opening 99 (and that is subsequently epitaxially regrown, as described hereinbelow) defines a second device region for a second type of MOS device. To this end, the unetched portions of the oxide layer 96 may be used to form at least part of the shallow trench isolation regions for electrically and physically isolating the first and second device regions from one another by designing the width and placement of the second etch opening 99 to be smaller than the width of the first etch opening 93, and contained within the first etch opening 93.

Figure 5:
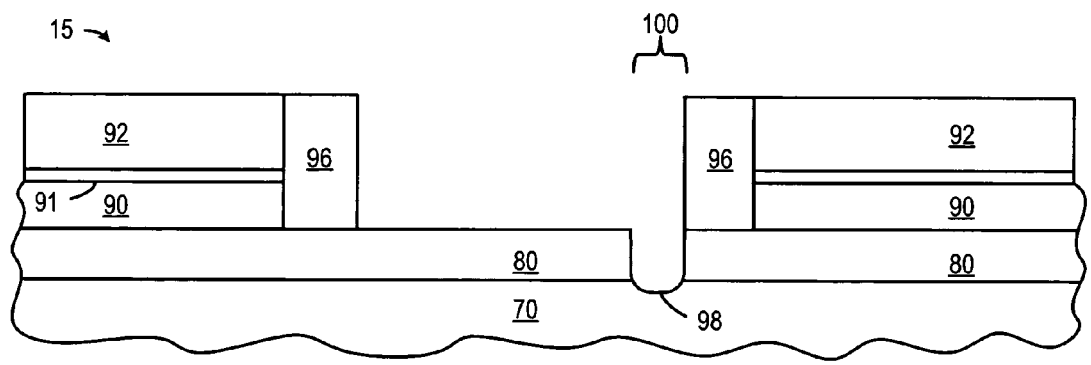
FIG. 5 illustrates processing subsequent to FIG. 4 where portions of the buried SOI oxide layer have been etched or removed to form a third opening that exposes the semiconductor substrate.

FIG. 5 illustrates processing of a semiconductor wafer structure 15 subsequent to FIG. 4 where portions of the buried SOI oxide layer 80 have been selectively etched or removed to form a third opening 100 that exposes a seed area 98 in the semiconductor substrate 70. It is recognized that, during the etch of the oxide layer 80, the oxide regions 96 will be recessed (not shown). This recess can be accommodated by the appropriate choice of thickness of the nitride layer 92. Any desired masking and selective etch process may be used to form seed areas 98 by removing portions of the buried SOI oxide layer to form one or more openings 100 that expose the semiconductor substrate, while otherwise retaining at least part of the buried SOI oxide layer 80. In a selected embodiment, the third opening 100 may be formed using a photoresist mask, alone or in combination with a highly anisotropic oxide etch process to expose the seed area 98.

Figure 6:
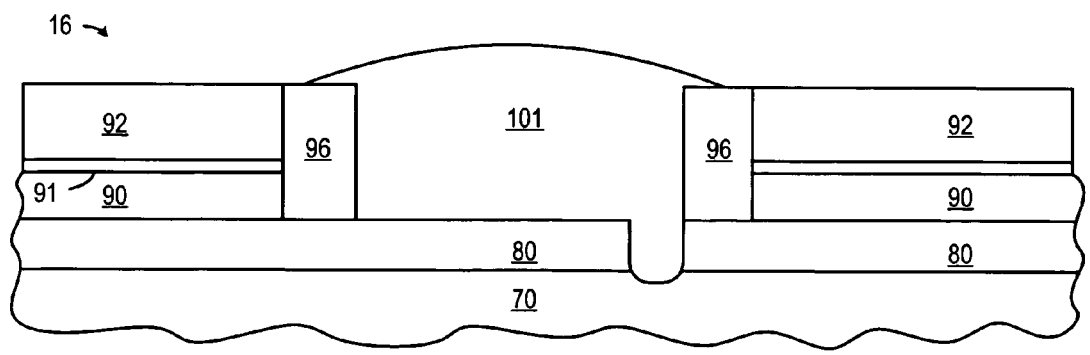
FIG. 6 illustrates processing subsequent to FIG. 5 after an epitaxial semiconductor layer is formed using a lateral epitaxial overgrowth process to partially or completely fill the openings from a semiconductor substrate seed area.

Turning now to FIG. 6, processing of a semiconductor wafer structure 16 subsequent to FIG. 5 is illustrated to show formation of a selective epitaxial semiconductor layer 101 using a lateral epitaxial overgrowth process to partially or completely fill the openings 100, 99 from a semiconductor substrate seed area 98 so that the seed region 101 is higher than the second semiconductor layer 90 and/or the mask layer 92. As illustrated, the epitaxial growth is seeded from a seed area 98 of the exposed semiconductor layer 70 so that the epi semiconductor layer 101 is formed. By using a single seed area 98 for lateral overgrowth, channel defects can be reduced or eliminated. In a selected embodiment, a high quality, defect-free epitaxial layer 101 is grown laterally from the seed area 98 and over the unetched buried SOI oxide layer 80 in the opening 99 to form an SOI substrate 101. As described herein and understood by those skilled in the art, the process of forming an epitaxial layer may be described as either depositing or growing a layer so that the "growth" and "deposition" terms are used interchangeably in this respect. By selectively forming the semiconductor layer 101 with a lateral overgrowth process so that its crystallographic orientation is different from the crystallographic orientation of the second semiconductor layer 90, the mobility of the holes and electrons for subsequently formed PMOS and NMOS devices, respectively, may be optimized. Since the laterally overgrown semiconductor layer 101 is epitaxially grown from the first semiconductor layer 70, they will have the same crystallographic orientations, though the layers 70, 101 can be formed of different semiconductor materials. Depending on the type of transistor device being fabricated, the semiconductor layer 101 may be formed from any (doped or undoped) semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility.

For example, if PMOS devices are formed over the semiconductor layer 101, the semiconductor layer 101 may be formed by epitaxially growing silicon having a crystallographic orientation (e.g., (110)) that is the same as the crystallographic orientation of the first semiconductor layer 70. This epitaxial growth may be achieved by heating the semiconductor wafer structure 16 to a temperature between 500 and 900° C. in the presence of dichlorosilane, HCL and hydrogen gas. Alternatively, if NMOS devices are formed over the semiconductor layer 101, at least a portion of the epitaxially grown layer 101 may be formed by epitaxially growing silicon having a (100) crystallographic orientation. In this case, the second semiconductor layer would have a (110) crystallographic orientation, and the PMOS device would be built on this layer. By optimizing the crystallographic orientations of the layers 101, 70 (e.g., so that the epitaxially grown layer 101, or "epi-layer," is formed of (110) semiconductor material and the second semiconductor layer 90 is formed of (100) semiconductor material), significant mobility improvements are obtained over single-orientation substrates—up to 2.5× improvement for hole mobility in PMOS devices formed over silicon dioxide gate layers. In addition, by completely filling the trench opening 99 with an epitaxial semiconductor layer 101 that grows above and over the nitride mask layer 92, crystalline defectivity in the trench opening 99 is reduced or minimized. It will be appreciated that, when the epi layer 101 is formed with n-type material, the second semiconductor layer 90 in the SOI region may be formed of depositing strained p-type semiconductor material having a second crystal orientation that is different from the first crystal orientation.

Figure 7:
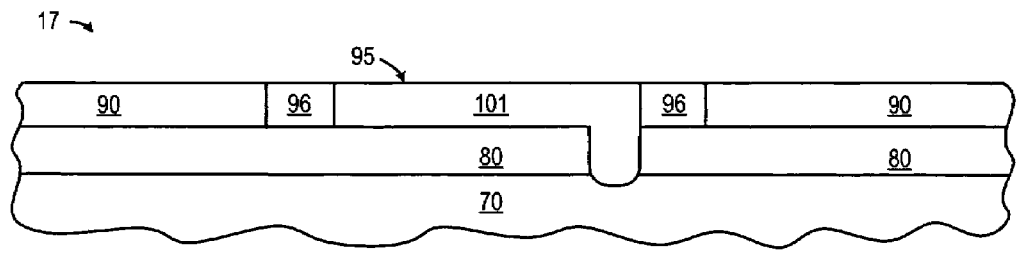
FIG. 7 illustrates processing subsequent to FIG. 6 after CMP polishing of the wafer structure.

FIG. 7 illustrates processing of a semiconductor wafer structure 17 subsequent to FIG. 6 after removing the nitride mask layer 92 and first oxide layer 91 and planarizing the epitaxial semiconductor layer 101 and second semiconductor layer 90. Chemical mechanical polishing or any desired etchant process may be used to planarized the semiconductor layers 101, 90, including dry etching, wet etching or oxidation of silicon. As for the removal of mask and oxide layers 92, 91, any desired stripping process may be used that is capable of selectively removing the patterned mask and oxide layers 92, 91 from the structure 17. As a result, a dual surface orientation structure having a substantially coplanar surface 95 is obtained by polishing and/or etching the semiconductor layer 101 back to the same level as the second semiconductor layer 90 and removing the layers of oxide 91 and nitride 92. Of course, the semiconductor layer 101 may be polished or etched back to a lesser or greater extent, but in any case is substantially coplanar with the second semiconductor layer 90 to facilitate CMOS processing.

Figure 8:
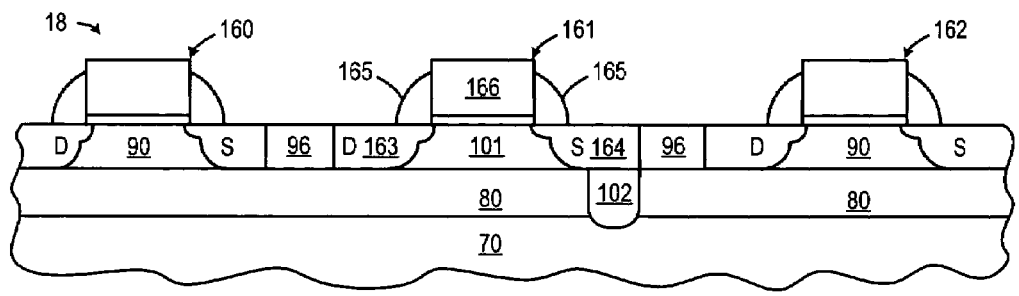
FIG. 8 illustrates processing subsequent to FIG. 7 after SOI devices are partially formed over the polished wafer structure.

FIG. 8 illustrates processing of a semiconductor wafer structure 18 subsequent to FIG. 7 after SOI devices 160, 161, 162 are partially formed over the polished wafer structure 18. For example, the depicted SOI devices (e.g., 161) may be formed as metal gate/high-k gate dielectric electrodes (e.g., 166) having source/drain regions (e.g., 163, 164) implanted around one or more sidewall spacers (e.g., 165) to provide a high performance CMOS device, though such advanced gate features are not required, and the planarized dual surface orientation wafer could also be integrated with other dielectric materials (such as silicon dioxide) and gate structures (such as polysilicon gates). In the implementation depicted in FIG. 8, PMOS and NMOS devices may be formed on the exposed semiconductor layers (i.e., second semiconductor layer 90 and epi semiconductor layer 101), which may include well regions (not shown) in each layer 90, 101. Specifically, a first gate electrode 160 is an NMOS device formed on a portion of the second conductive layer 90 in the SOI region, and a second gate electrode 161 is a PMOS device formed on a portion of the epitaxially overgrown semiconductor layer 101. Alternatively, the first gate electrode 160 may be a PMOS device and the second gate electrode 161 may be an NMOS device. The allocation of device types to device regions preferably exploits the differing crystal orientation of the underlying layers 90, 101 to provide a high performance CMOS device where the PMOS device has improved hole mobility. This may be accomplished, for example, by forming the PMOS devices over the semiconductor material that has a (110) or (111) orientation, whereas the NMOS devices are formed over a semiconductor surface having a (100) orientation. In addition, the hole mobility of the PMOS devices may be further improved by forming the PMOS gate electrodes over a layer of compressed silicon germanium having a (110) orientation.

In accordance with various alternative embodiments, different types of SOI devices may be formed, depending on the size and configuration of the seed regions used to form the laterally overgrown semiconductor layer. For example, the SOI devices formed over the overgrown semiconductor layers (e.g., device 161 depicted in FIG. 8) may be placed so that the source regions 164 for each SOI device 161 are located over a seed region 102. In this example, the SOI device 161 is formed by covering the seed region 102 with the source region 164, resulting in a fully floating body channel beneath the gate electrode 166. The resulting device 161 has a reduced junction capacitance at the drain and otherwise performs as an SOI device that is readily incorporated into a planar DSO integration.

Figure 9:
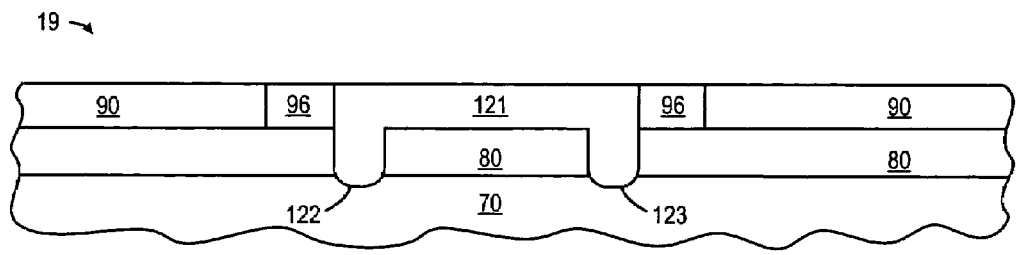
FIG. 9 illustrates processing subsequent to FIG. 4 where portions of the buried SOI oxide layer have been etched or removed to form two openings that expose the semiconductor substrate, and where an epitaxial semiconductor layer has been formed using a lateral epitaxial overgrowth process to partially or completely fill the openings from two semiconductor substrate seed areas.
Figure 10:
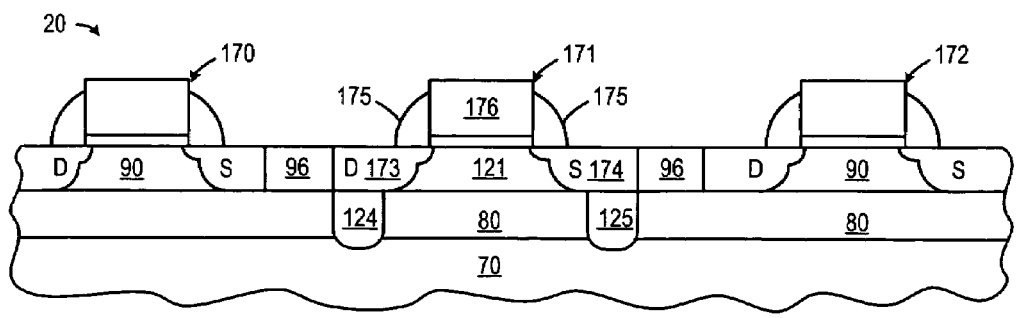
FIG. 10 illustrates processing subsequent to FIG. 9 after SOI devices are partially formed over the polished wafer structure.

In addition to using a single seed to laterally overgrown a substrate, multiple seeds can be used to form SOI substrates. This is illustrated beginning with FIG. 9 which illustrates processing of a semiconductor wafer structure 19 subsequent to FIG. 4 where portions of the buried SOI oxide layer 80 have been etched or removed to form two openings or seed areas 122, 123 that expose the semiconductor substrate 70. Using these seed areas 122, 123, a lateral epitaxial overgrowth process is used to partially or completely fill the openings and form an epitaxial semiconductor layer 121 that is subsequently polished until coplanar with the second semiconductor layer 90. Over this DSO substrate, the SOI devices 170-172 may be formed as depicted in the wafer structure 20 shown in FIG. 10, where an SOI device 171 (including gate electrode 176, sidewall spacers 175 and source/drain regions 173, 174) is formed over the laterally overgrown semiconductor layer 121. The SOI device 171 is placed so that the drain regions 173 and source regions 174 for each SOI device 171 are located over a seed region 124, 125, respectively. In this example, the SOI device 171 is formed by covering the seed regions 124, 125 with the drain and source regions 173, 174. The resulting SOI device 171 obtains the performance benefits of having its channel formed over an SOI substrate 121 and is otherwise readily incorporated into a planar DSO integration.

Figure 11:
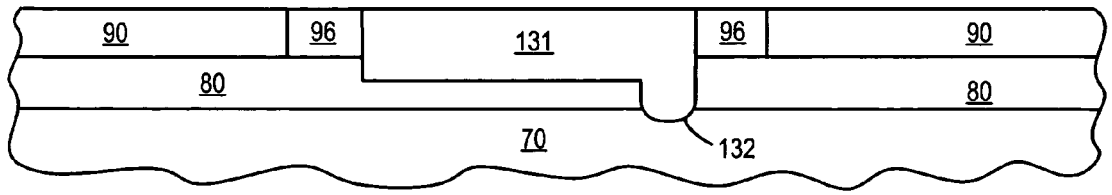
FIG. 11 illustrates processing subsequent to FIG. 4 where portions of the buried SOI oxide layer have been etched or removed to thin the buried SOI oxide layer and to form an opening that exposes the semiconductor substrate, and where an epitaxial semiconductor layer has been formed using a lateral epitaxial overgrowth process to partially or completely fill the openings from a semiconductor substrate seed area.
Figure 12:
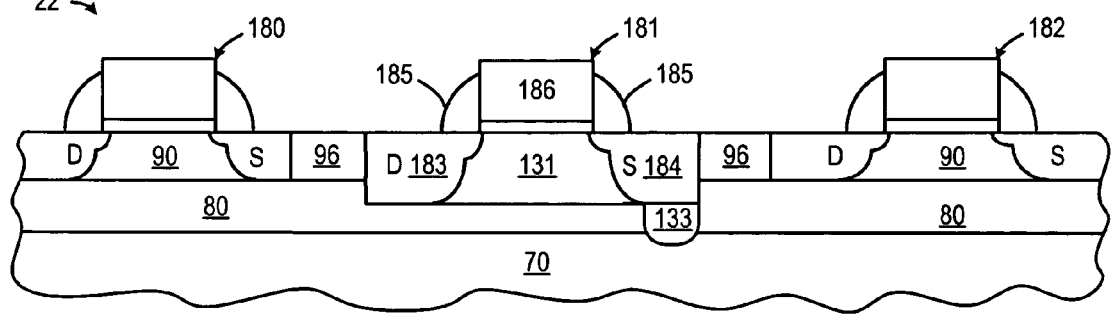
FIG. 12 illustrates processing subsequent to FIG. 11 after SOI devices are partially formed over the polished wafer structure.

Various embodiments may also be used to fabricate thicker SOI substrate layers, such as illustrated beginning with FIG. 11 which illustrates processing of a semiconductor wafer structure 21 subsequent to FIG. 4 where a portion of the SOI oxide layer that 80 has been partially thinned before portions of the remaining buried SOI oxide layer 80 are etched or removed to form an opening or seed area 132 that exposes the semiconductor substrate 70. Using the seed area 132, a lateral epitaxial overgrowth process is used to partially or completely fill the openings and form an epitaxial semiconductor layer 131 that is subsequently polished until coplanar with the second semiconductor layer 90. Over this DSO substrate, the SOI devices 180-182 may be formed as depicted in the wafer structure 22 shown in FIG. 12. In particular, an SOI device 181 (including gate electrode 186, sidewall spacers 185 and source/drain regions 183, 184) is formed over the overgrown semiconductor layer 131 by locating at least the source regions 184 for each SOI device 181 over a seed region 133. In this example, the SOI device 181 is formed by covering the seed region 133 with the source region 184. The resulting SOI device 181 obtains the performance benefits of having its channel formed over a thicker SOI substrate 131, having reduced junction capacitance at the drain and being otherwise readily incorporated into a planar DSO integration.

Figure 13:
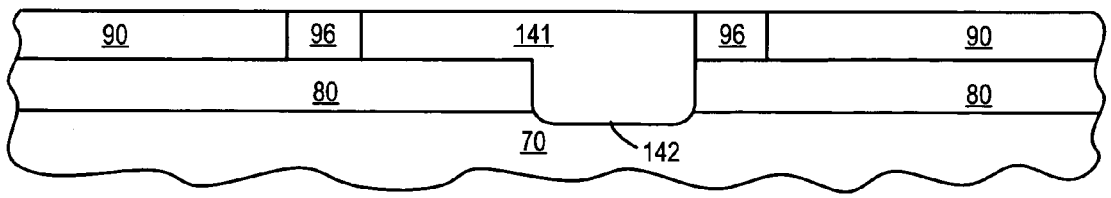
FIG. 13 illustrates processing subsequent to FIG. 4 where portions of the buried SOI oxide layer have been etched or removed to form an opening that exposes the semiconductor substrate, and where an epitaxial semiconductor layer has been formed using a lateral epitaxial overgrowth process to partially or completely fill the openings from a semiconductor substrate seed area.
Figure 14:
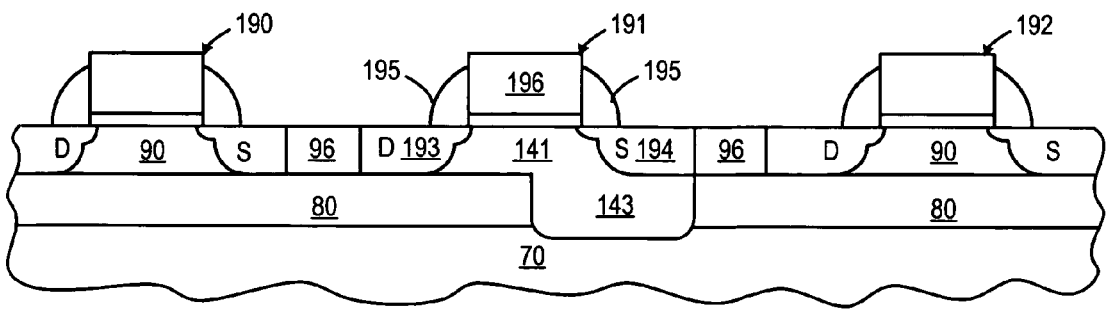
FIG. 14 illustrates processing subsequent to FIG. 13 after quasi-SOI devices are partially formed over the polished wafer structure.

In yet other embodiments, quasi-SOI devices may be fabricated, such as illustrated beginning with FIG. 13 which illustrates processing of a semiconductor wafer structure 23 subsequent to FIG. 4 where portions of the buried SOI oxide layer 80 are etched or removed to form a relatively wide opening or seed area 142 that exposes the semiconductor substrate 70. Using the seed area 142, a lateral epitaxial overgrowth process is used to partially or completely fill the openings and form an epitaxial semiconductor layer 141 that is subsequently polished until coplanar with the second semiconductor layer 90. Over this DSO substrate, the SOI devices 190-192 may be formed as depicted in the wafer structure 24 shown in FIG. 14. In particular, an SOI device 191 (including gate electrode 196, sidewall spacers 195 and source/drain regions 193, 194) is formed over the overgrown semiconductor layer 141 by locating the source region 194 and at least part of the channel region for each SOI device 191 over a seed region 143. In this example, the SOI device 191 is formed by covering part of the seed region 143 with the source region 194, though the remainder of the seed region 143 contact the channel formed under the gate 196, thereby forming a quasi-SOI device 191. The resulting SOI device 181 obtains the performance benefits of having reduced junction capacitance at the drain and reduced or eliminated floating body effects, and being otherwise readily incorporated into a planar DSO integration.

Figure 15:
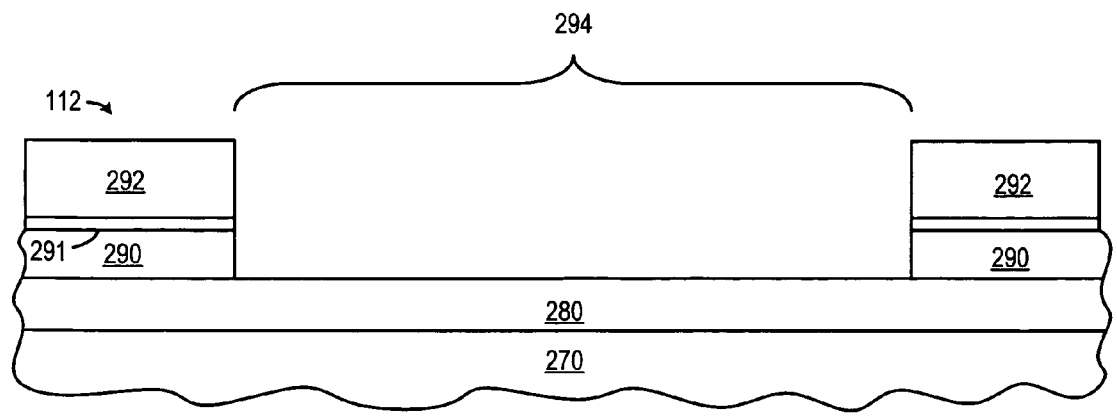
FIG. 15 is a partial cross-sectional view of a semiconductor wafer structure where portions of an SOI semiconductor layer have been etched or removed to form a first opening to expose a portion of a buried SOI oxide layer.

As described herein, the seed regions may be formed with any desired selective etch process that removes portions of the buried SOI oxide layer to form one or more openings or seed areas that expose the semiconductor substrate. An illustrative embodiment is described beginning with FIG. 15, which depicts a partial cross-sectional view of a semiconductor wafer structure 112 including a semiconductor substrate layer 270 and SOI oxide/insulator layer 280 on which etched SOI semiconductor layers 290, oxide layers 291, and nitride mask layers 292 form a first opening 294 to expose a portion of the buried SOI oxide layer 280. As will be appreciated, one or more pattern and etch steps may be used to mask and selectively remove the unprotected portions of the layers 290-292, including a dry etching process such as reactive-ion etching, ion beam etching, plasma etching or laser etching, a wet etching process wherein a chemical etchant is employed or any combination thereof.

Figure 16:
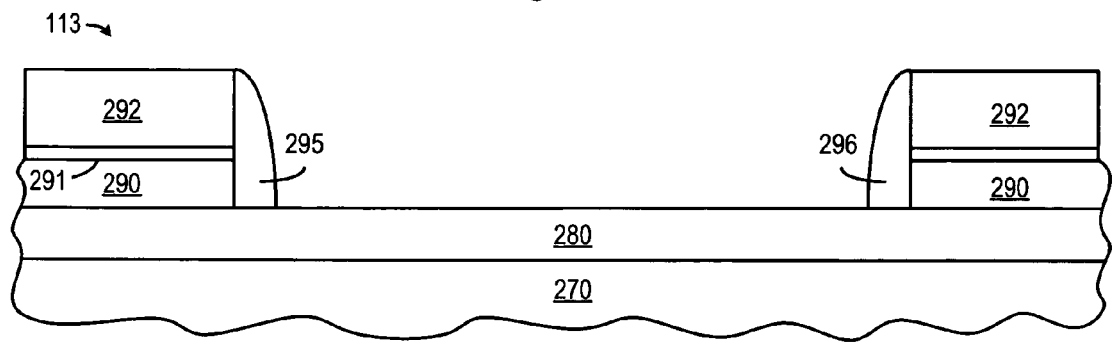
FIG. 16 illustrates processing subsequent to FIG. 15 after oxide sidewall spacers are formed on the vertical surfaces of the first opening.

Next, oxide sidewall spacers 295, 296 are formed on the vertical surfaces of the first opening 294 of the semiconductor wafer structure 113 illustrated in FIG. 16. The sidewall spacers 295, 296 may be formed by depositing one or more relatively thick dielectric layers (e.g., a 500 Angstroms layer of oxide) over the wafer structure 113 using any desired deposition process, and then anisotropically etching the deposited dielectric layer to form the sidewall spacers 295, 296. Depending on the constituent materials and dimensions of the deposited dielectric layer(s), the etching may use one or more anisotropic etch processes to form sidewall spacers 295, 296, including a dry etching process (such as reactive-ion etching, ion beam etching, plasma etching, laser etching), or any combination thereof. In a selected illustrative embodiment, the sidewall spacer processing details may be selected to obtain on each side a minimum predetermined total spacer width (e.g., approximately 100-150 Angstroms).

Figure 17:
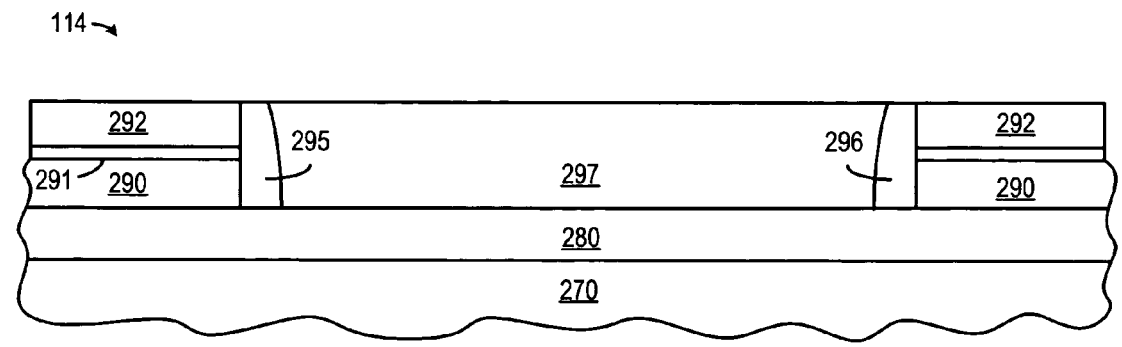
FIG. 17 illustrates processing subsequent to FIG. 16 after a sacrificial nitride layer is formed over the oxide sidewall spacers in the first opening.

Once the sidewall spacers 295, 296 are formed, the remainder of the opening 294 is filled with a sacrificial layer 297, as illustrated with the wafer structure 114 depicted in FIG. 17. For example, a sacrificial layer 297 may be deposited over the sidewall spacers 295, 296 and then etched, polished or otherwise planarized to fill the opening 294. In a selected embodiment, the sacrificial fill layer 297 is formed from a material that is different from the material used to form the sidewall spacers 295, 296 so that the two materials may be selectively etched. For example, the sacrificial fill layer 297 may be formed by depositing a nitride layer in the opening 294 and over the sidewall spacers 295, 296, and then etching, polishing or otherwise planarizing the nitride layer to fill the opening 294. In another embodiment, the sacrificial fill layer 297 is formed by depositing a nitride underfill layer (e.g., by forming a nitride layer that is thicker than the combined thickness of the SOI semiconductor layer 290 and oxide layer 291 but thinner than the combined thickness of the SOI semiconductor layer 290, oxide layer 291 and nitride layer 292 so that it does not completely fill the opening 294) over the sidewall spacers 295, 296, and then depositing a TEOS layer or other conformal oxide layer over the nitride underfill layer, where the resulting structure is then etched, polished or otherwise planarized to fill the opening 294.

Figure 18:
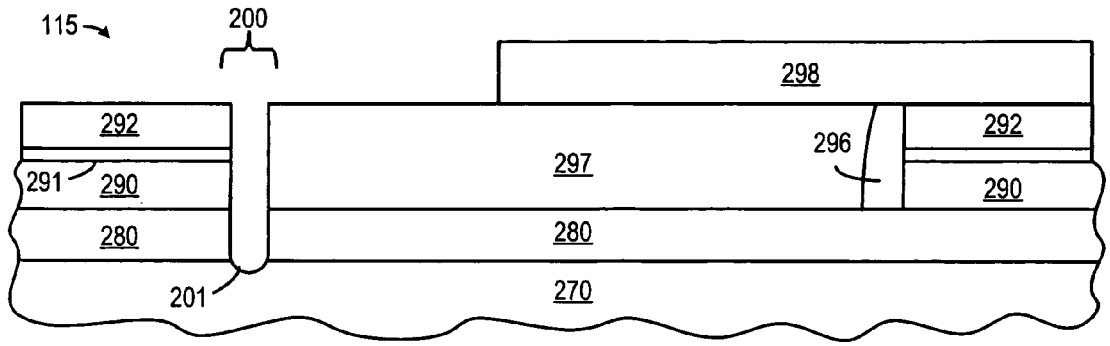
FIG. 18 illustrates processing subsequent to FIG. 17 after an etched nitride mask layer is formed and at least one of the oxide sidewall spacers and a portion of the buried SOI oxide layer have been etched or removed to form an opening that exposes the semiconductor substrate.

FIG. 18 illustrates processing of the semiconductor wafer structure 115 subsequent to FIG. 17 after a nitride mask layer 298 is selectively formed over the wafer structure 115 to expose at least one of the sidewall spacers (e.g., 295). Next, at least one of the oxide sidewall spacers (e.g., 295) and a portion of the buried SOI oxide layer 280 are selectively etched or removed to form an opening 200 that exposes the semiconductor substrate 270 to form a seed area 201. The selective etch may be implemented with an etch chemistry, such as Hf, that is selective to nitride, so that only the exposed oxide sidewall spacer 295 and buried SOI oxide layer 280 are etched. In the scheme mentioned, the formation of the oxide sidewall spacers will likely result is some thinning of the buried oxide during the spacer overetch, which may result in the "feature" of a thicker SOI, as previously mentioned. This can be tuned by the etch chemistry or composition of the sidewall spacer oxide to be minimized.

Figure 19:
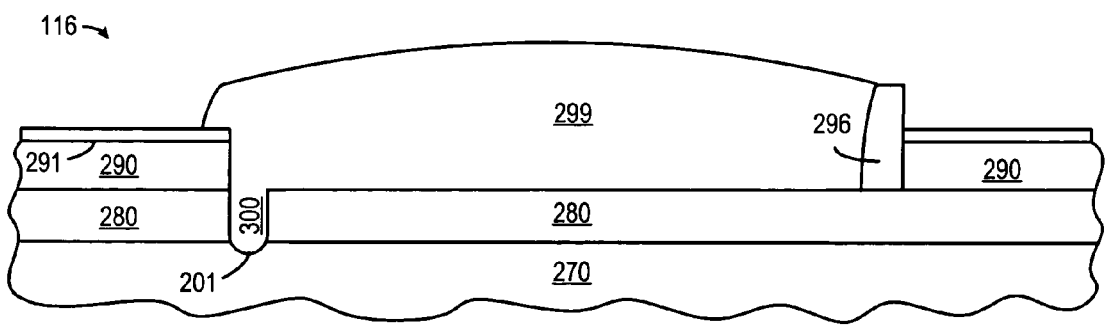
FIG. 19 illustrates processing subsequent to FIG. 18 after an epitaxial semiconductor layer is formed using a lateral epitaxial overgrowth process to partially or completely fill the openings from a semiconductor substrate seed area.
Figure 20:
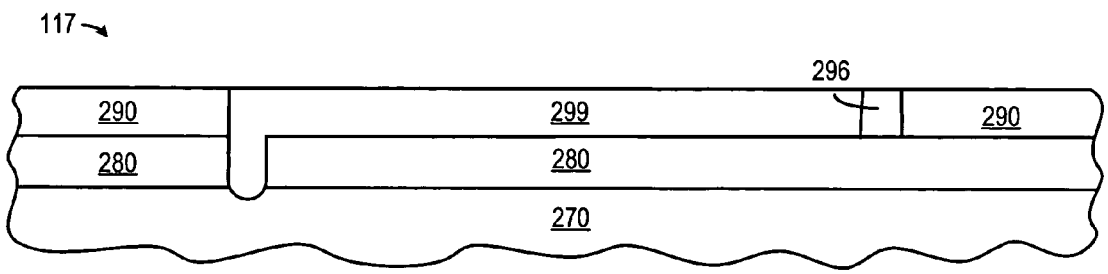
FIG. 20 illustrates processing subsequent to FIG. 19 after CMP polishing of the wafer structure.

Turning now to FIG. 19, processing of a semiconductor wafer structure 116 subsequent to FIG. 18 is illustrated to show formation of a selective epitaxial semiconductor layer 299 using a lateral epitaxial overgrowth process. In particular, after stripping or removing the nitride layers 292, 297, 298 with an appropriate etch chemistry, a lateral epitaxial growth process is used to partially or completely fill the openings and form an epitaxial semiconductor layer 299 from the seed area 201. As illustrated, the epitaxially overgrown layer 299 completely fills and overflows the etched opening in the SOI layers 280, 290. Any overflow in the epitaxially overgrown layer 299 may be removed with a CMP polish step until coplanar with the second semiconductor layer 290, as illustrated with the semiconductor wafer structure 117 depicted in FIG. 20. The resulting DSO substrate includes artifacts from the preceding fabrication steps, including any unetched sidewall spacers 296, as well as the seed region 300. Over this DSO substrate, SOI devices (such as described above) may be formed so that at least the source region is located over the seed region 300.

Figure 21:
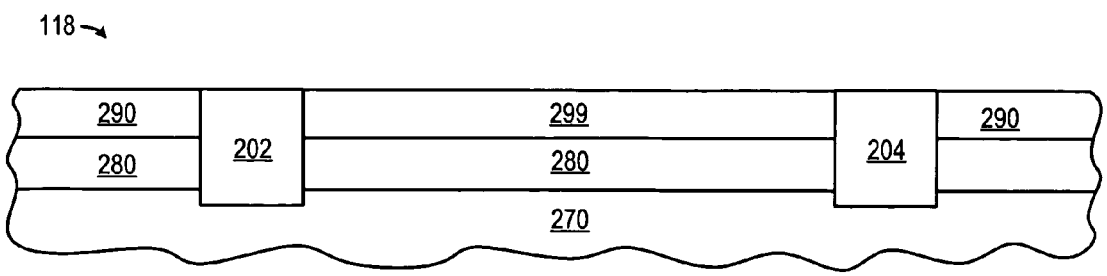
FIG. 21 illustrates processing subsequent to FIG. 20 after isolation regions are formed in the wafer structure to remove the semiconductor substrate seed area and isolate first and second SOI layers.

In yet another embodiment of the present invention, contact between the bulk semiconductor layer 270 and the epitaxially overgrown semiconductor layer 299 may be eliminated by removing the seed regions 300. FIG. 21 illustrates processing of the semiconductor wafer structure 118 subsequent to FIG. 20 after isolation regions 202, 204 are formed in the wafer structure 118 to remove the semiconductor substrate seed area 300 and isolate the first SOI semiconductor layer 290 from the second SOI semiconductor layer 299. It will be appreciated that isolation regions 202, 204 may be formed as field oxide regions or isolation dielectric trenches using any desired process. Alternatively, isolation dielectric trenches may be formed using conventional LOCOS processing in which silicon nitride is deposited and patterned to define the isolation regions and, thereafter, the exposed silicon of wafer structure 118 is thermally oxidized to form the isolation dielectric. However formed, the shallow trench isolations regions 202, 204 provide electrical and physical isolation between transistor devices formed on the epitaxially overgrown semiconductor layer 299 and transistor devices formed on the second semiconductor layer 290.

It will be appreciated that additional processing steps will be used to complete the fabrication of first and second gate electrodes into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Figure 22:
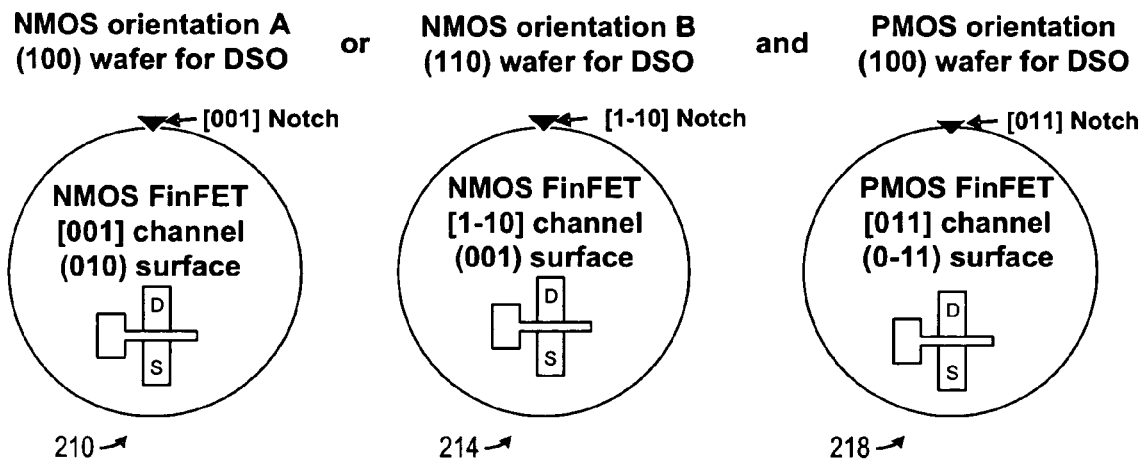
FIG. 22 which illustrates how aligned CMOS FinFET devices may be integrated on a dual surface SOI wafer.

As described herein, the formation of DSO SOI substrates by lateral epitaxial overgrowth allows high mobility FinFET devices to be integrated on a DSO so that the NMOS and PMOS devices are aligned with parallel channels. An example implementation is depicted in FIG. 22 which illustrates how CMOS FinFET devices may be integrated on a dual surface SOI wafer so that n- and p-FinFET devices are aligned in parallel to have an optimal mobility. As depicted, NMOS FinFET devices may be formed on a first substrate surface (e.g., the second semiconductor layer 90 depicted in FIG. 7) having an NMOS orientation A (e.g., on a (100) substrate as indicated with reference numeral 210) or an NMOS orientation B (e.g., on a (110) substrate as indicated with reference number 214). These NMOS FinFET devices may be combined with PMOS FinFet devices formed on a second substrate surface (e.g., the first epitaxial semiconductor layer 101 depicted in FIG. 7) having a PMOS orientation (e.g., on a (100) substrate as indicated with reference number 218). The alignment of the NMOS and PMOS devices is controlled by relative alignment of the wafer notches of the two crystallographic orientations in the starting substrate, for example the wafer notch with crystallographic orientation where NMOS will be formed can be aligned with the wafer notch with crystallographic orientation where PMOS will be formed as shown in FIG. 22.

In one form, there is provided herein a method for fabricating a dual surface orientation semiconductor structure by forming a first semiconductor layer having a first crystal orientation (e.g., (110) n-type silicon) and then forming a second semiconductor layer that has a second, different crystal orientation (e.g., (100) p-type silicon) over the first semiconductor layer that is electrically isolated from the first semiconductor layer by an insulator layer. By forming a first trench opening in the second semiconductor layer to expose the insulator layer in a first area, an exposed insulator layer is formed. The first trench opening may be formed by using a mask formed over the second semiconductor layer to etch the second semiconductor layer in a second area that is wider than the first area (thereby forming an isolation trench opening to expose the insulator layer), filling the isolation trench opening with an insulating material, and then selectively etching the insulating material in the isolation trench opening over the first area to form the first trench opening to expose the insulator layer in the first area. In addition, the formation of the first trench opening may include removing a part of the exposed insulator layer in the first area to thin the exposed insulator layer. Subsequently, a second trench opening is formed in the exposed insulator layer to expose a seed area in the first semiconductor layer that is smaller than the first area. In a selected embodiment, the second trench openings may be formed by forming one or more oxide sidewall spacers on one or more vertical sidewalls of the first trench opening, filling the remainder of the first trench opening with a sacrificial nitride layer, selectively etching the oxide sidewall spacer(s) and a portion of the exposed insulator layer over the seed area to form at least one second trench opening that exposes the seed area in the first semiconductor layer and then removing the sacrificial nitride layer. From this seed area, a first epitaxial semiconductor material is epitaxially grown to fill the second trench opening and to grow laterally over the exposed insulator layer to fill at least part of the first trench opening, thereby forming a first epitaxial semiconductor layer that is electrically isolated from the second semiconductor layer. If the exposed insulator layer is thinned during formation of the first trench opening, the epitaxial growth step will create a first epitaxial semiconductor layer over the exposed insulator layer that is thicker than the second semiconductor layer. With a chemical mechanical polish process, the first epitaxial semiconductor layer and the second semiconductor layer are planarized so that SOI transistor devices may be formed. For example, SOI transistor devices may be formed over the first area having at least a source region formed in the first epitaxial semiconductor layer that covers or overlies the first epitaxial semiconductor material in the second trench opening. Where two seed areas in the first area are formed from separate trenches to the first semiconductor layer, the SOI transistor devices may be formed where both the source and drain regions cover the epitaxial semiconductor material that is grown in the separate trenches. Alternatively, quasi-SOI transistor devices may be formed over the first area that include a gate electrode formed at least in part over at least a part of the seed area, a gate dielectric layer, and a source region formed in the first epitaxial semiconductor layer that partially covers the first epitaxial semiconductor material in the second trench opening. To form completely isolated SOI layers, one or more isolation regions may be formed after the first epitaxial semiconductor layer is formed to electrically isolate the first epitaxial semiconductor layer from the second semiconductor layer and to replace at least the first epitaxial semiconductor material in the second trench opening.

In another form, there is provided herein a method of forming an integrated circuit structure wherein a second semiconductor layer is formed over at least part of a first semiconductor layer so that the second semiconductor layer is isolated from the first semiconductor layer by a buried insulator layer. By selectively etching a portion of the isolation region, the buried insulator layer is exposed in a first area, and by selectively etching a portion of the exposed buried insulator layer, a seed trench opening is formed in the buried insulator layer that exposes a seed area in the first semiconductor layer that is smaller than the first area. From this seed area, a first epitaxial semiconductor material having is epitaxially grown laterally over the exposed buried insulator layer to form a first epitaxial semiconductor layer that is isolated from the second semiconductor layer. As formed, the first epitaxial semiconductor layer may have a crystal orientation that is the same as or different from the crystal orientation of the second semiconductor layer. By planarizing the first epitaxial semiconductor layer and second semiconductor layer with a CMP process, transistor devices may be formed over the first area that include a gate electrode, a gate dielectric layer and a source region formed in the first epitaxial semiconductor layer that covers at least part of the first epitaxial semiconductor material grown in the seed trench opening.

In yet another form, there is provided a method for fabricating a semiconductor structure having dual substrates. Under the method first and second semiconductor layers are formed so that they are isolated from each other by a buried insulator layer and so that the second semiconductor layer is formed over the buried insulator layer which is formed over the first semiconductor layer. After removing a portion of the second semiconductor layer to expose the buried insulator layer in a first area, a portion of the exposed buried insulator layer is selectively etched to form a trench opening that exposes the first semiconductor layer in a second area that is smaller than the first area. An epitaxial semiconductor material may be epitaxially grown from the second area of the first semiconductor layer to fill the trench opening and to grow laterally over the exposed buried insulator layer, thereby forming a first epitaxial semiconductor layer that is adjacent the second semiconductor layer. In the final structure, all or part of the first epitaxial semiconductor layer is used to form a first substrate, and all or part of the second semiconductor layer is used to form a second substrate, where the first and second substrates are laterally isolated from one another by an isolation region.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 8 is for first well (not shown) in the layer 90 to be an n-doped well and the second well (not shown) in the layer 101 to be p-doped. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes provides a DSO integration having the performance benefits of SOI substrates. In addition, the process and performance limitations associated with non-uniform substrate heights and/or inferior fabrication techniques (such as SIMOX or wafer bonding) may be reduced or eliminated. In selected embodiments, the epitaxial lateral overgrowth techniques disclosed herein allows quasi-SOI devices, as well as SOI devices with recessed source/drains. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a dual surface orientation semiconductor structure, comprising:
   forming a first semiconductor layer having a first crystal orientation;
   forming an insulator layer over the first semiconductor layer;
   forming a second semiconductor layer over the insulator layer, where the second semiconductor layer has a second crystal orientation that is different from the first crystal orientation;
   forming a first trench opening in the second semiconductor layer to expose the insulator layer in a first area, thereby forming an exposed insulator layer;
   forming at least one second trench opening in the exposed insulator layer to expose a seed area in the first semiconductor layer that is smaller than the first area; and
   epitaxially growing a first epitaxial semiconductor material from the seed area of the first semiconductor layer that fills the second trench opening and grows laterally over the exposed insulator layer to fill at least part of the first trench opening, thereby forming a first epitaxial semiconductor layer that is isolated from the second semiconductor layer.

2. The method of claim 1, further comprising planarizing the first epitaxial semiconductor layer and the second semiconductor layer.

3. The method of claim 1, where forming the first trench opening comprises:
   forming a mask over the second semiconductor layer;
   using the mask to etch the second semiconductor layer in a second area that is wider than the first area, thereby forming an isolation trench opening to expose the insulator layer;
   filling the isolation trench opening with an insulating material; and
   selectively etching the insulating material in the isolation trench opening over the first area to form the first trench opening to expose the insulator layer in the first area.

4. The method of claim 1, wherein the second semiconductor layer comprises (100) p-type silicon and the first epitaxial semiconductor layer comprises (110) n-type silicon.

5. The method of claim 1, further comprising removing a part of the exposed insulator layer in the first area to thin the exposed insulator layer prior to forming the at least one second trench opening.

6. The method of claim 5, wherein epitaxially growing a first epitaxial semiconductor material creates a first epitaxial semiconductor layer over the exposed insulator layer that is thicker than the second semiconductor layer.

7. The method of claim 1, further comprising forming one or more oxide sidewall spacers on one or more vertical sidewalls of the first trench opening.

8. The method of claim 7, wherein forming at least one second trench opening comprises:
   filling the first trench opening with a sacrificial nitride layer after forming the oxide sidewall spacers; and
   selectively etching an oxide sidewall spacer and a portion of the exposed insulator layer over the seed area to form at least one second trench opening that exposes the seed area in the first semiconductor layer.

9. The method of claim 8, further comprising removing the sacrificial nitride layer before epitaxially growing a first epitaxial semiconductor material.

10. The method of claim 1, further comprising:
   forming a first SOI transistor device over the first area, wherein the first SOI transistor device comprises a gate electrode, a gate dielectric layer and a source region formed in the first epitaxial semiconductor layer that covers the first epitaxial semiconductor material in the second trench opening; and
   forming a second SOI transistor device outside the first area, wherein the second SOI transistor device comprises a gate electrode, a gate dielectric layer and source/drain regions formed in the second semiconductor layer.

11. The method of claim 1, wherein forming at least one second trench opening comprises forming second and third separate trench openings in the exposed insulator layer to expose two separate seed areas in the first semiconductor layer, wherein each seed area is smaller than the first area.

12. The method of claim 11, further comprising:
forming a first SOI transistor device over the first area comprising
a gate electrode,
a gate dielectric layer,
a source region formed in the first epitaxial semiconductor layer that overlies the first epitaxial semiconductor material in the second trench opening, and
a drain region formed in the first epitaxial semiconductor layer that overlies the first epitaxial semiconductor material in the third trench opening; and
forming a second SOI transistor device outside the first area, wherein the second SOI transistor device comprises a gate electrode, a gate dielectric layer and a source/drain regions formed in the second semiconductor layer.

13. The method of claim 1, further comprising:
forming a first SOI transistor device over the first area comprising a gate electrode formed at least in part over at least a part of the seed area, a gate dielectric layer, and a source region formed in the first epitaxial semiconductor layer that partially overlies the first epitaxial semiconductor material in the second trench opening; and
forming a second SOI transistor device outside the first area, wherein the second SOI transistor device comprises a gate electrode, a gate dielectric layer and source/drain regions formed in the second semiconductor layer.

14. The method of claim 1, further comprising forming a first isolation region after forming the first epitaxial semiconductor layer, wherein the first isolation region replaces at least the first epitaxial semiconductor material in the second trench opening and wherein the first isolation region isolates the first epitaxial semiconductor layer from the second semiconductor layer.

15. A method of forming an integrated circuit structure, comprising:
forming a first semiconductor layer;
forming a second semiconductor layer over at least part of the first semiconductor layer, wherein the second semiconductor layer is isolated from the first semiconductor layer by a buried insulator layer;
selectively etching at least a portion of the second semiconductor layer to expose the buried insulator layer in a first area;
selectively etching at least a portion of the exposed buried insulator layer to form a seed trench opening in the buried insulator layer that exposes a seed area in the first semiconductor layer that is smaller than the first area; and
epitaxially growing a first epitaxial semiconductor material from the seed area of the first semiconductor layer that grows laterally over the exposed buried insulator layer to form a first epitaxial semiconductor layer that is isolated from the second semiconductor layer.

16. The method of claim 15, where the first epitaxial semiconductor layer has a first crystal orientation and the second semiconductor layer has a second crystal orientation that is different from the first crystal orientation.

17. The method of claim 15, where the first epitaxial semiconductor layer has a first crystal orientation and the second semiconductor layer has a second crystal orientation that is the same as the first crystal orientation.

18. The method of claim 15, further comprising planarizing the first epitaxial semiconductor layer and second semiconductor layer with a CMP process.

19. The method of claim 15, further comprising:
forming a first transistor device over the first area, wherein the first transistor device comprises a gate electrode, a gate dielectric layer and a source region formed in the first epitaxial semiconductor layer that covers at least part of the first epitaxial semiconductor material grown in the seed trench opening.

20. A method for fabricating a semiconductor structure having dual substrates, comprising:
forming first and second semiconductor layers that are isolated from each other by a buried insulator layer, where the second semiconductor layer is formed over the buried insulator layer which is formed over the first semiconductor layer;
removing a portion of the second semiconductor layer to expose the buried insulator layer in a first area;
selectively etching a portion of the exposed buried insulator layer to form a trench opening that exposes a second area in the first semiconductor layer that is smaller than the first area; and
epitaxially growing a first epitaxial semiconductor material from the second area of the first semiconductor layer that fills the trench opening and grows laterally over the exposed buried insulator layer, thereby forming a first epitaxial semiconductor layer that is adjacent the second semiconductor layer, wherein at least a portion of the first epitaxial semiconductor layer and the second semiconductor layer form first and second substrates, respectively, that are laterally isolated from one another by an isolation region.

* * * * *